(12) United States Patent
Huang et al.

(10) Patent No.: US 9,374,933 B2
(45) Date of Patent: Jun. 21, 2016

(54) SHIELDING DEVICE AND ELECTRONIC DEVICE HAVING THE SAME

(71) Applicant: Wistron Corporation, New Taipei (TW)

(72) Inventors: Hou-Chun Huang, New Taipei (TW); Tzu-Chieh Huang, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 88 days.

(21) Appl. No.: 13/912,054

(22) Filed: Jun. 6, 2013

(65) Prior Publication Data

US 2014/0043785 A1 Feb. 13, 2014

(30) Foreign Application Priority Data

Aug. 7, 2012 (TW) .............................. 101128464 A

(51) Int. Cl.
*H05K 9/00* (2006.01)

(52) U.S. Cl.
CPC ............ *H05K 9/0007* (2013.01); *H05K 9/0022* (2013.01); *H05K 9/0032* (2013.01)

(58) Field of Classification Search
CPC . H05K 9/0007; H05K 9/0032; H05K 9/0026; H05K 9/0024; H05K 9/002; H05K 9/0022
USPC ........................................................ 361/818
See application file for complete search history.

(56) References Cited

U.S. PATENT DOCUMENTS

| 5,436,802 | A  | * | 7/1995 | Trahan et al. ................. 361/816 |
| 5,886,879 | A  | * | 3/1999 | Matuschik .................... 361/818 |
| 6,390,320 | B2 |   | 5/2002 | Hurst et al. |
| 6,992,901 | B1 |   | 1/2006 | Hung |
| 8,247,707 | B2 | * | 8/2012 | Li ................................. 174/382 |
| 8,373,076 | B2 | * | 2/2013 | Cao ............................... 174/382 |

(Continued)

FOREIGN PATENT DOCUMENTS

| CN | 2678168 Y | 2/2005 |
| CN | 101408682 A | 4/2009 |

(Continued)

OTHER PUBLICATIONS

Office Action mailed Dec. 3, 2015 in corresponding CN Application No. 201210287556.4, and English translation of pp. 3-7.

*Primary Examiner* — Hoa C Nguyen
*Assistant Examiner* — Keith Depew
(74) *Attorney, Agent, or Firm* — Muncy, Geissler, Olds & Lowe, P.C.

(57) ABSTRACT

A shielding device and an electronic device having the same are disclosed. The shielding device is disposed on a circuit board for covering an electronic component. The shielding device comprises a first case and a second case. The first case comprises a first limiting structure and a second limiting structure. The second case is mounted on the circuit board and includes a frame and a first slot. The frame forms an opening. When the first case is connected with the second case, the second limiting structure can move along a first direction to a bottom of the frame and is prevented from moving along a second direction. The first slot corresponds to the first limiting structure to allow the first limiting structure to be inserted into the first slot along the first direction and the first limiting structure is prevented from moving along the second direction.

19 Claims, 8 Drawing Sheets

(56) References Cited

U.S. PATENT DOCUMENTS

2005/0219831 A1* 10/2005 Vinokor et al. ............... 361/797
2007/0205010 A1* 9/2007 Chen et al. ....................... 174/50
2007/0274054 A1* 11/2007 Lu et al. ......................... 361/727
2012/0012381 A1* 1/2012 Cao ................................ 174/377
2013/0250540 A1* 9/2013 Hou ............................... 361/818

FOREIGN PATENT DOCUMENTS

CN  202340362 U   7/2012
TW  201119545 A1  6/2011

* cited by examiner

SHIELDING DEVICE AND ELECTRONIC DEVICE HAVING THE SAME

BACKGROUND OF THE INVENTION

1. Field of the Invention

The present relates to a shielding device and an electronic device having the shielding device, and more particularly, to a shielding device which facilitates easy maintenance of an electronic component, and an electronic device having the shielding device.

2. Description of the Related Art

As electronics technology advances, electronic devices evolve to have both compact form factors and powerful features/capabilities. Therefore, more electronic components can be integrated in a smaller area in an electronic device. However, since different electronic components tend to affect each other because of electromagnetic interference, a shielding device is often used for covering electronic components to isolate different electronic components.

Please refer to FIG. 1A for a structural view of a shielding device of the prior art, and FIG. 1B for a view of the shielding device disposed on the circuit board of the prior art.

The prior art shielding device 91 comprises a first case 911 and a second case 912 fixed with each other through an engaging structure 914. The second case 912 comprises a cross bar 913 for assembling equipment 80 to be attached thereto, and then the second case 912 is installed on a circuit board 90, thereby protecting an electronic component 92 on the circuit board 90 and preventing the noise generated by the electronic component 92 from affecting other sophisticated components. When the second case 912 is installed on the circuit board 90, it is necessary to attach assembling equipment 80 to the center of the cross bar 913 in order to keep the balance of the second case 912. If the second case 912 gets too big or heavy, it could slant or lean during the installation. Besides, since the cross bar 913 is disposed at the center of the second case 912, it is necessary to cut the cross bar 913 to reach the electronic component 92 for maintenance, which is not only time consuming but also is possible to damage the electronic component 92.

Furthermore, please refer to FIG. 1C for a view of an engaging structure of the shielding device of the prior art.

Since the first case 911 and the second case 912 are fixed with each other through the protruding engaging structure 914, a height H of the first case 911 is not smaller than 1.5 mm because of the limitation of the protruding structure. Besides, when a height of the second case 912 also approaches 1.5 mm, using surface mount technology (SMT) might lead to a permanently fixed state for the first case 911 and the second case 912, making it difficult to assemble.

Therefore, it is necessary to propose a new shielding device and an electronic device having the shielding device to solve the problems encountered in the prior art technique.

SUMMARY OF THE INVENTION

It is an object of the present invention to provide a shielding device which facilitates easy maintenance of an electronic component.

It is another object of the present invention to provide an electronic device having the shielding device as described above.

In order to achieve the above objects, the present invention discloses a shielding device disposed on a circuit board for covering an electronic component, the shielding device comprising a first case and a second case. The first case comprises an upper casing, a lateral casing, at least one first limiting structure, and at least one second limiting structure. The upper casing is formed in a plate shape. The lateral casing is connected to the upper casing. The at least one first limiting structure is connected to the lateral casing. The at least one second limiting structure is connected to the upper casing. The second case is mounted on the circuit board. The second case comprises a frame and at least one first slot. The frame is forming an opening; wherein when the first case is connected with the second case, at least one portion of the at least one the second limiting structure can move along a first direction to a bottom of the frame and the at least one second limiting structure is prevented from moving along a second direction, wherein the first direction is perpendicular to the second direction. The at least one first slot is disposed in the frame. The at least one first slot is corresponding to the at least one first limiting structure respectively to allow the at least one first limiting structure to be inserted into the first slot along the first direction and the at least one first limiting structure is prevented from moving along the second direction.

The present invention also discloses an electronic device having a shielding device, a circuit board, and an electronic component. The electronic component is disposed on the circuit board; and the shielding device is disposed on the circuit board for covering the electronic component. The shielding device comprises a first case and a second case. The first case comprises an upper casing, a lateral casing, at least one first limiting structure, and at least one second limiting structure. The upper casing is formed in a plate shape. The lateral casing is connected to the upper casing. The at least one first limiting structure is connected to the lateral casing. The at least one second limiting structure is connected to the upper casing. The second case is mounted on the circuit board. The second case comprises a frame and at least one first slot. The frame is forming an opening; wherein when the first case is connected with the second case, at least one portion of the at least one the second limiting structure can move along a first direction to a bottom of the frame and the at least one second limiting structure is prevented from moving along a second direction, wherein the first direction is perpendicular to the second direction. The at least one first slot is disposed in the frame. The at least one first slot is corresponding to the at least one first limiting structure respectively to allow the at least one first limiting structure to be inserted into the first slot along the first direction and the at least one first limiting structure is prevented from moving along the second direction.

DETAILED DESCRIPTION OF THE PREFERRED EMBODIMENT

The advantages and innovative features of the invention will become more apparent from the following detailed description when taken in conjunction with the accompanying drawings.

Figure 1A:
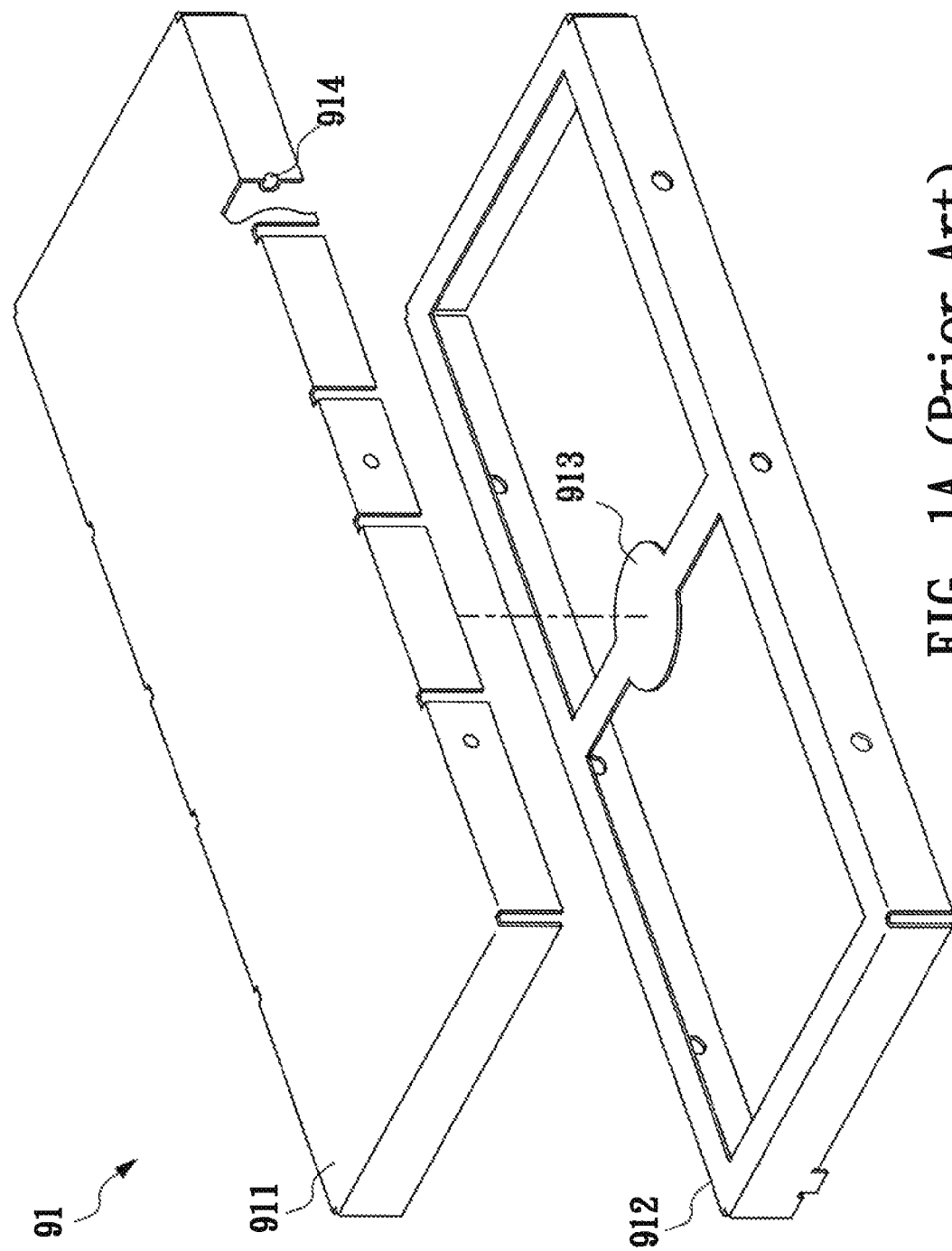
FIG. 1A illustrates a structural view of a shielding device of the prior art.
Figure 1B:
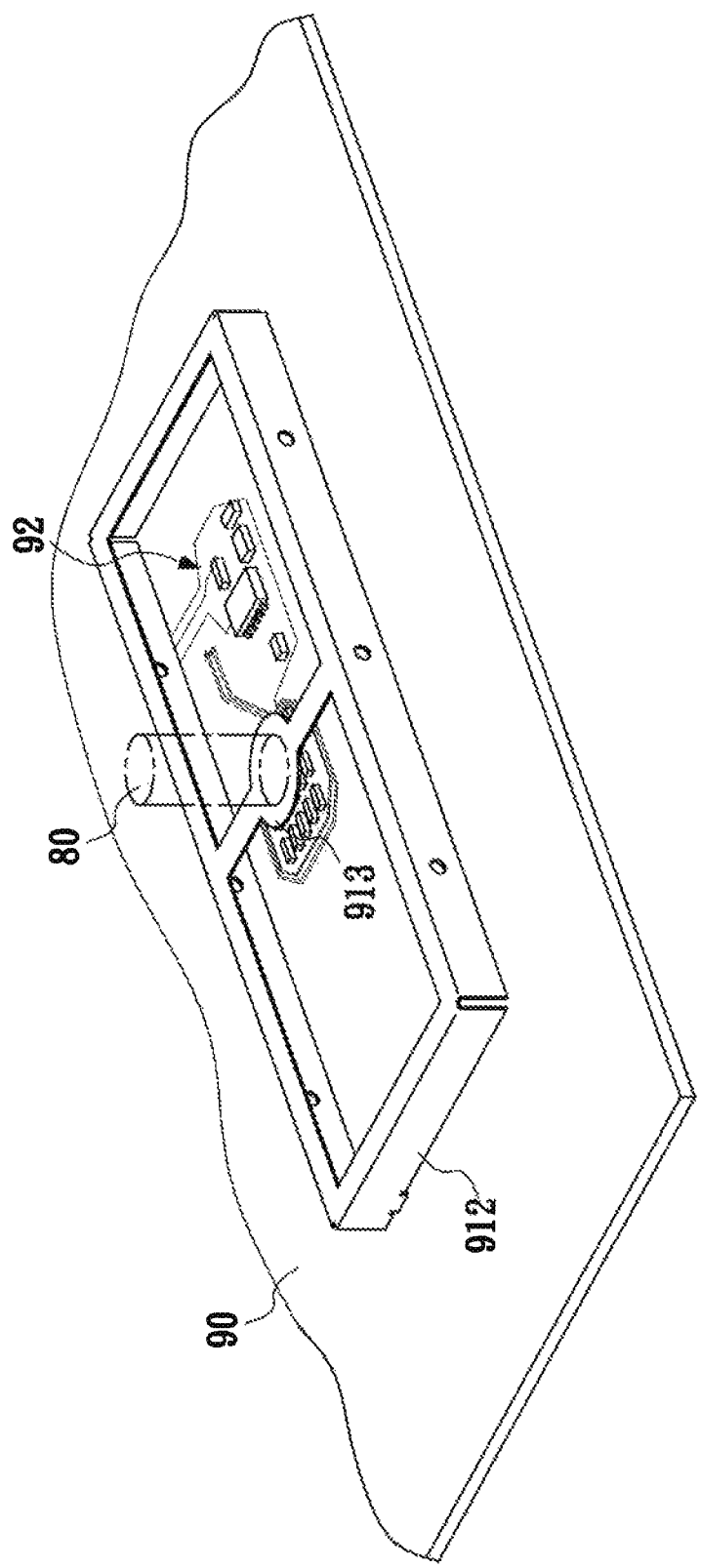
FIG. 1B illustrates a view of the shielding device disposed on the circuit board of the prior art.
Figure 1C:
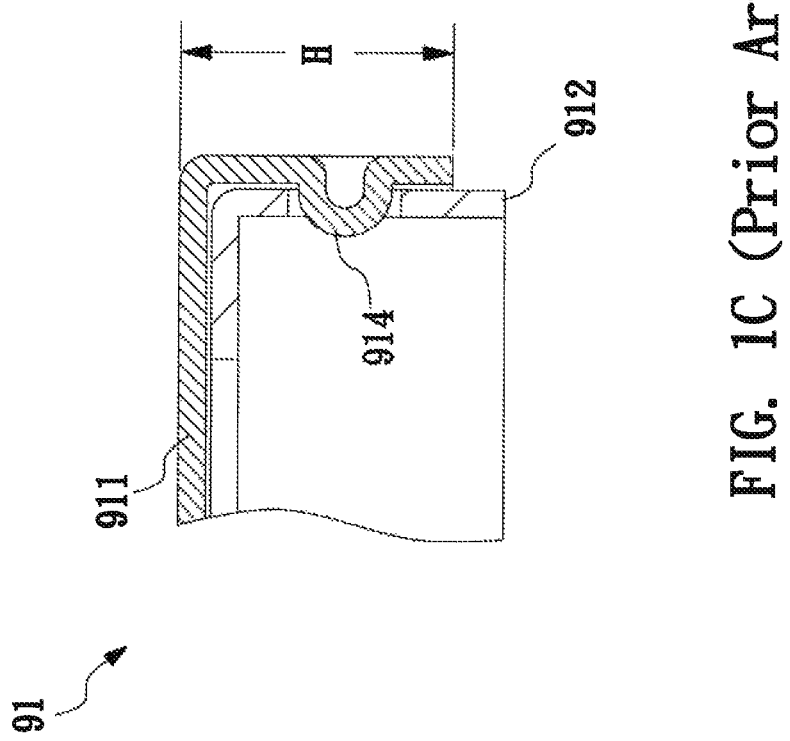
FIG. 1C illustrates a view of an engaging structure of the shielding device of the prior art.
Figure 2A:
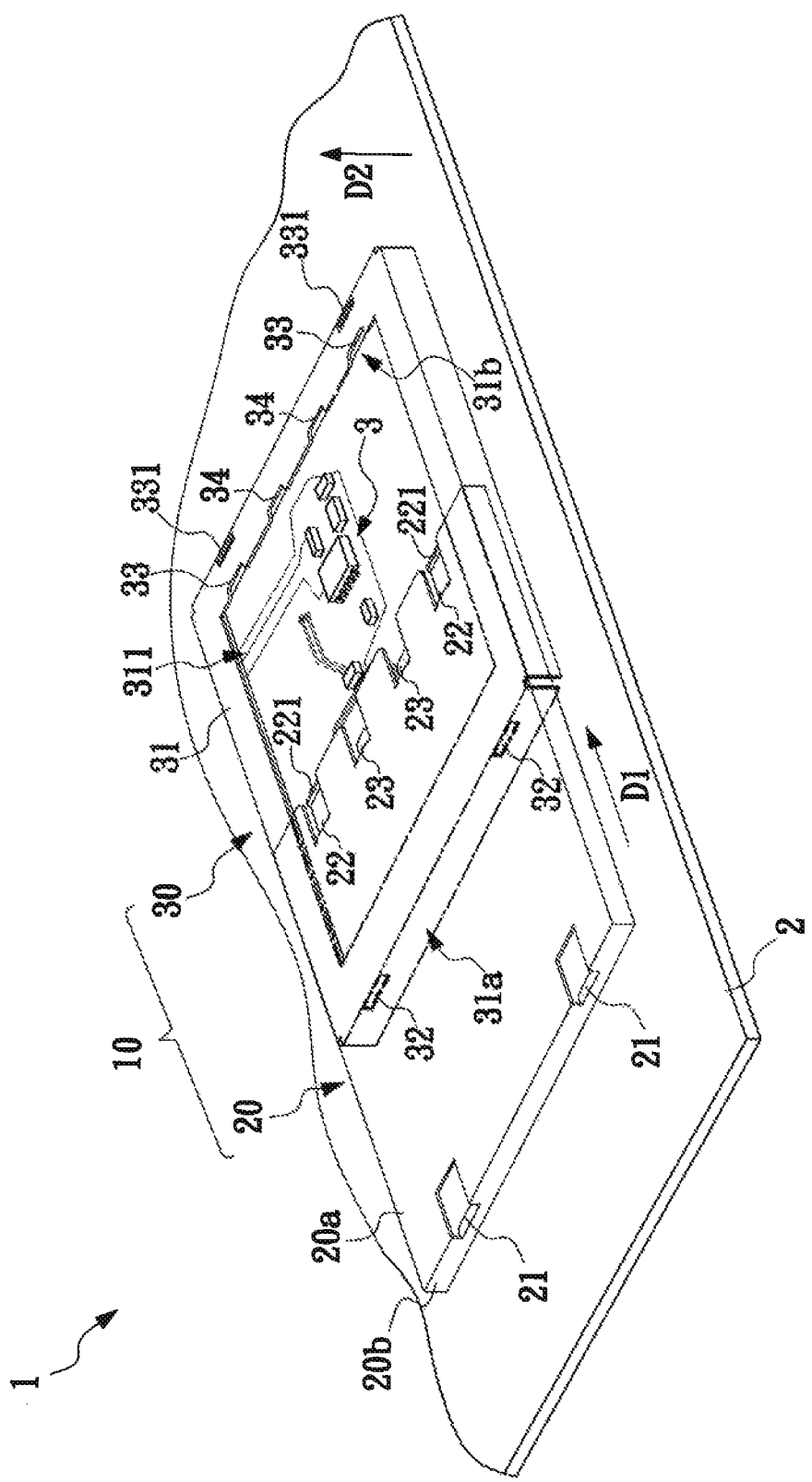
FIG. 2A illustrates a view of a first embodiment of a shielding device disposed on the circuit board of the present invention.

Please refer to FIG. 2A for a view of a first embodiment of a shielding device disposed on the circuit board of the present invention.

An electronic device 1 of the present invention can be a mobile phone, a notebook PC, a tablet PC, or the like. The electronic device 1 comprises a circuit board 2 disposed therein, wherein the circuit board 2 has an electronic component 3 disposed thereon and covered by a shielding device 10. The functions of the electronic component 3 are not related to the present invention and will not be described. The shielding device 10 can protect the electronic component 3 and keep the noise generated by the electronic component 3 from affecting other sophisticated components in the electronic device 1. The shielding device 10 comprises a first case 20 and a second case 30. The second case 30 is mounted on the circuit board 2 by using surface mount technology (SMT); the first case 20 is connected to the second case 30 through a sliding mechanism.

The first case 20 comprises an upper casing 20a, a lateral casing 20b, at least one first limiting structure 21, at least one second limiting structure 22, and at least one third limiting structure 23. The upper casing 20a is formed in a plate shape, the lateral casing 20b is connected to the upper casing 20a. The lateral casing 20b can be bended to form a U shape and connected with the upper casing 20a perpendicularly. The first limiting structure 21 is connected to the lateral casing 20b, and the second limiting structure 22 and third limiting structure 23 are disposed at the upper casing 20a. The second case 30 comprises a frame 31, a first slot 32, a first gap 33, and a second gap 34. In a first embodiment of the present invention, the first case 20 comprises two first limiting structures 21, two second limiting structures 22, and two third limiting structures 23. The frame 31 forms an opening 311 to let a user see the electronic component 3 below the frame 31. The frame 31 of FIG. 2A is formed in a rectangular shape, but the frame can be formed in any other shapes such as a ring shape or some irregular shape. The first slot 32 is disposed at an outer side 31a of the frame 31 and has a size corresponding to that of the first limiting structure 21. When the first case 20 is to be connected with the second case 30, the first limiting structure 21 is inserted into the first slot 32 along the first direction D1, thereby preventing the first limiting structure 21 from moving along the second direction D2. Meanwhile, at least a portion of the second limiting structure 22 can move to the bottom of the frame 31 along the first direction D1, thereby preventing the second limiting structure 22 from moving along the second direction D2. The first direction D1 is perpendicular to the second direction D2.

Besides, in a preferred embodiment of the present invention, the second case 30 can comprise at least one first gap 33, the at least one first gap 33 can be disposed at an inner side 31b of the frame 31 to correspond to the size of the second limiting structure 22 respectively, so the second limiting structure 22 can move along the first direction D1 to slide to the bottom of the frame 31 through the first gap 33. Therefore, when the first case 20 slides to engage with the second case 30, the first case 20 can cover the opening 311 of the second case 30, and the first case 20 is prevented from moving in the second direction D2 by the first limiting structure 21 and the second limiting structure 22. In a preferred embodiment of the present invention, the first limiting structures 21 and the second limiting structures 22 are disposed at opposing sides of the first case 20 respectively to balance the stress exerted on the first case 20.

Figure 3:
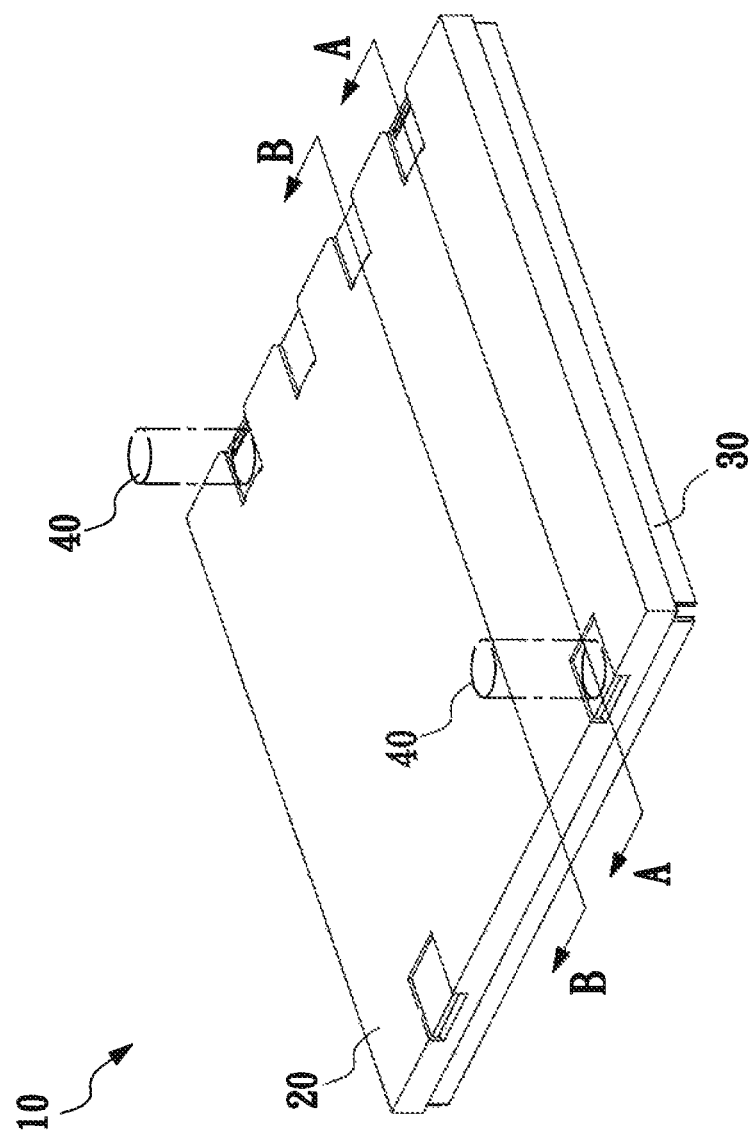
FIG. 3 illustrates a structural view of the shielding device of the present invention.
Figure 3A:
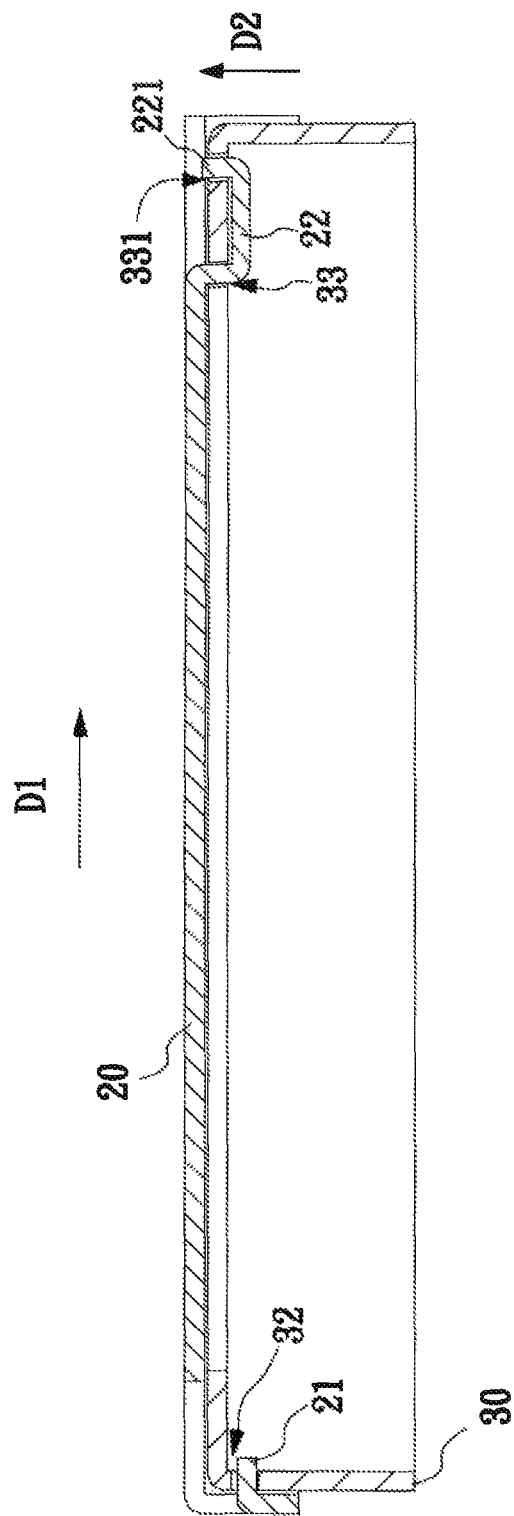
FIG. 3A illustrates a sectional view from the A-A section of FIG. 3.

Each second limiting structure 22 can further extend to form an engaging structure 221 to make the second limiting structure 22 look like a U-shaped structure (as shown in FIG. 3A). The frame 31 of the second case 30 can have at least one second slot 331 corresponding to the at least one second limiting structure 22 respectively. When the first case 20 engages with the second case 30, each engaging structure 221 can be connected and fastened to the second slot 331 to prevent the first case 20 to move arbitrarily in the horizontal direction. Meanwhile the engaging structure 221 is perpendicular with the frame 31 of the second case 30 respectively. The user can press the engaging structure 221 to let the engaging structure 221 break away from the second slot 331, thereby allowing the first case 20 to slide away from the second case 30. Therefore, the first case 20 and second case 30 can easily engage with each other to form the shielding device 10 or break away from each other for facilitating convenient maintenance of the electronic component 3 down under.

Figure 3B:
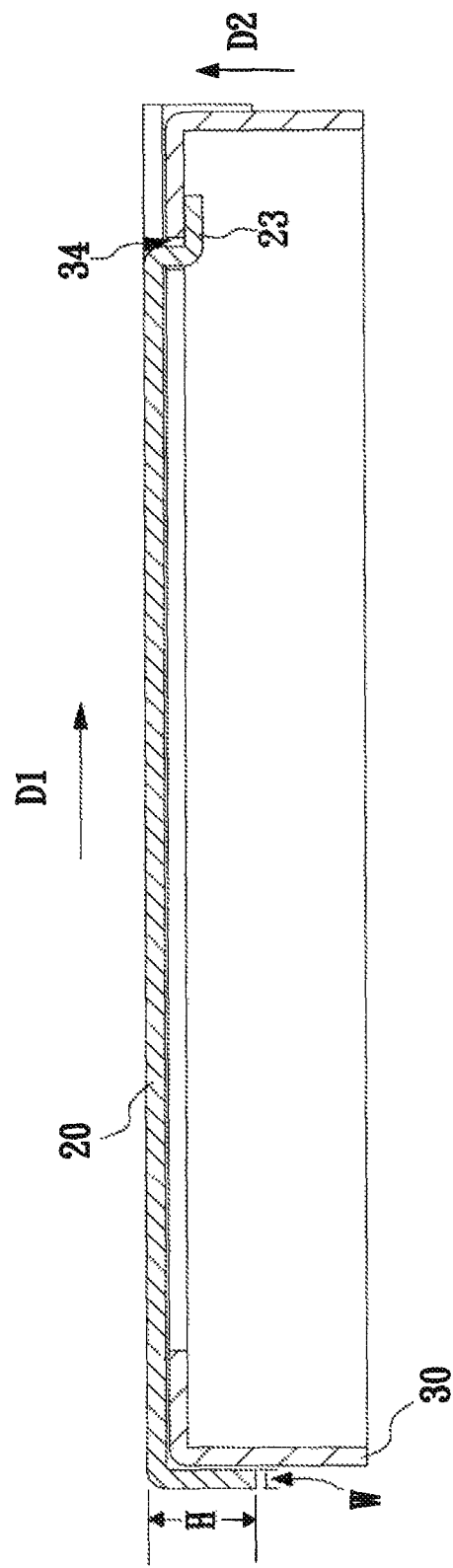
FIG. 3B illustrates a sectional view from the B-B section of FIG. 3.

Additionally, in order to fixedly connect the first case 20 and the second case 30, the first case 20 can have a third limiting structure 23, the third limiting structure 23 is formed to be an L-shaped structure (as shown in FIG. 3B). The second case 30 can have a second gap 34 corresponding to the third limiting structure 23. The second gap 34 is also disposed at the inner side 31b of the frame 31 and has a size corresponding to that of the third limiting structure 23, so the third limiting structure 23 can slide along the first direction D1 to the bottom of the frame 31 through the second gap 34, wherein the third limiting structure 23 is prevented from moving in the second direction D by the frame 31. The L-shaped structure of the third limiting structure 23 comprises a perpendicular portion for limiting the movement in the first direction D1 and a horizontal portion for limiting the movement in the second direction D2. The third limiting structure 23 and the second limiting structure 22 can be disposed at the same side of the first case 20; similarly, the first gap 33 and the second gap 34 can be disposed at the same side of the second case 30. The third limiting structure 23 and the second limiting structure 22 can be arranged by turns, while the first gap 33 and the second gap 34 can also be arranged by turns. However, the present invention can have any other type of arrangements. The third limiting structure 23 can be disposed at the side with the first limiting structure 21.

Figure 2B:
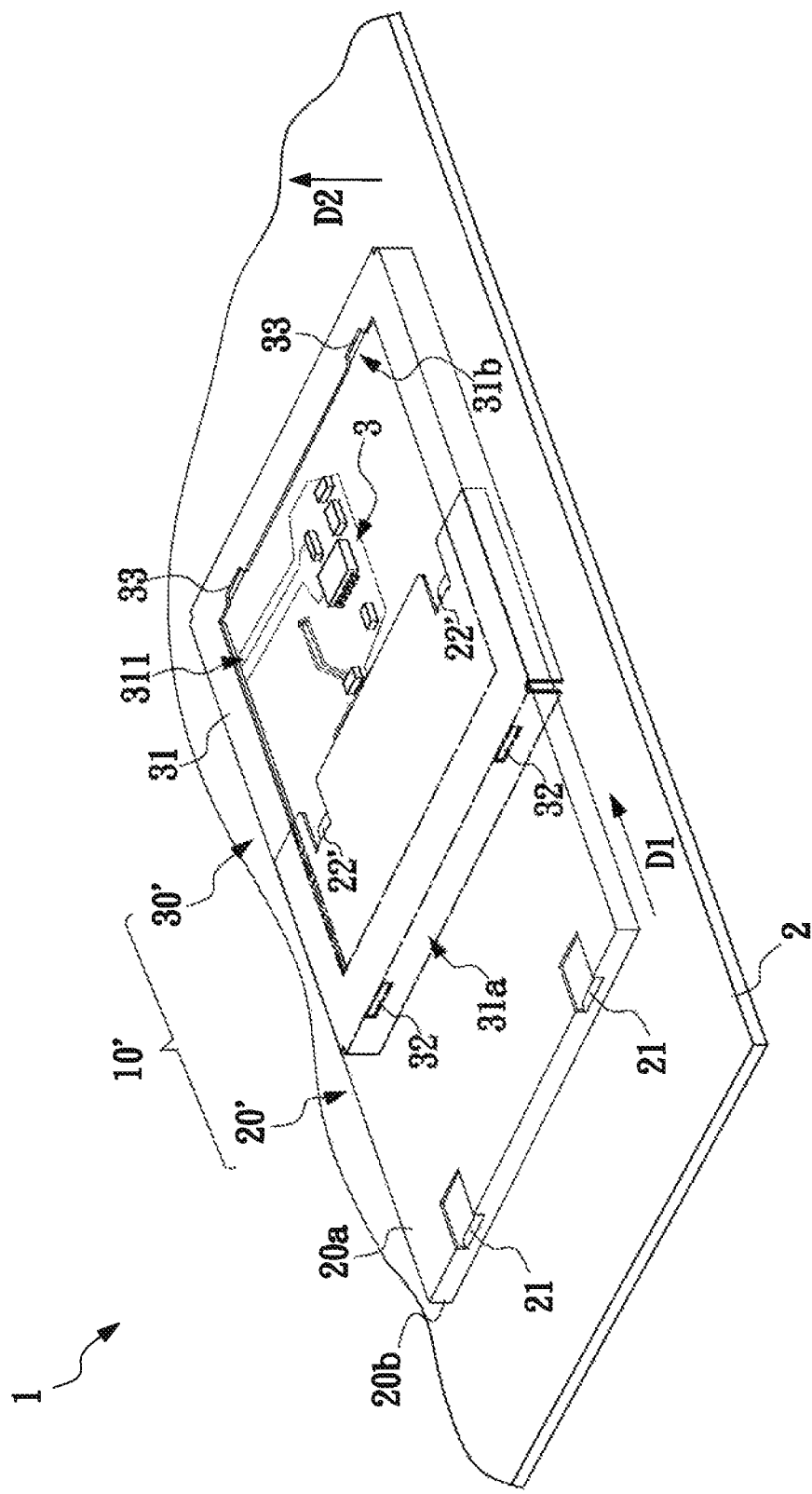
FIG. 2B illustrates a view of a second embodiment of a shielding device disposed on the circuit board of the present invention.

Please refer to FIG. 2B for a view of a second embodiment of a shielding device disposed on the circuit board of the present invention.

In the second embodiment of the present invention, the shielding device 10' also comprises a first case 20' and a second case 30', but the first case 20' only comprises the first limiting structure 21 and the second limiting structure 22', the second case 30' only comprises the first slot 32 and the first gap 33. Also in the second embodiment, the second limiting structure 22' does not comprise the engaging structure 221, so the second limiting structure 22' is formed as an L-shaped structure, wherein a perpendicular portion of the L-shaped structure of the second limiting structure 22' is used for limiting the movement in the first direction D1, a horizontal portion is used for limiting the movement in the second direction D2. Therefore, in the second embodiment, the first case 20' can also conveniently engage with the second case 30', and both the first limiting structure 21 and the second limiting structure 22' can be used for limiting the movement according to design requirements.

According to the first embodiment of the present invention, FIG. 3 shows the appearance of the shielding device after the first case 20 is connected with the second case 30.

When the first case 20 is connected with the second case 30, the shielding device can completely cover the opening 311 and the electronic component 3 below the opening 311 to avoid noise interference. By using the first limiting structure 21, the second limiting structure 22, and the third limiting structure 23, the first case 20 and the second case 30 can be tightly integrated. On the other hand, when the shielding device 10 is disposed on the circuit board 2, the assembling equipment 40 does not need to be at the center of the first case 20 or the second case 30, the assembling equipment 40 can be attached to the frame 31 of the second case 30 as well.

FIG. 3A illustrates a sectional view from the A-A section of FIG. 3, which shows the first limiting structure 21 and the second limiting structure 22.

The first limiting structure 21 can move along the first direction D1 to be inserted to the first slot 32, the first limiting structure 21 can prevent the frame 31 from moving in the second direction D2. Meanwhile, the second limiting structure 22 can be inserted from the first gap 33 to move along the first direction D1 to the bottom of the frame 31, so the second limiting structure 22 can prevent the frame 31 from moving in the second direction D2. Also the engaging structure 221 of the second limiting structure 22 is stuck with the second slot 331 to be perpendicular to the frame 31, thereby preventing the first case 20 from moving in any direction.

FIG. 3B illustrates a sectional view from the B-B section of FIG. 3, which shows the third limiting structure 23.

Similarly, the third limiting structure 23 can be inserted from the second gap 34 to move along the first direction D1 to the bottom of the frame 31, so the third limiting structure 23 can prevent the frame 31 from moving in the second direction D2. From the sectional view of FIG. 3B, the height H of the first case 20, which is calculated from the upper casing 20a to the end of the lateral casing 20b, can be as small as possible. Therefore, the height H can be two to three times the thickness W of the cross section of the lateral casing 20b of the first case 20, such as 0.6 mm. By doing so, the present invention provides the following advantages: the total height of the shielding device 10 can be reduced; and it is preventing to permanently weld the first case 20 and the second case 30.

It is noted that the above-mentioned embodiments are only for illustration. It is intended that the present invention cover modifications and variations of this invention provided they fall within the scope of the following claims and their equivalents. Therefore, it will be apparent to those skilled in the art that various modifications and variations can be made to the structure of the present invention without departing from the scope or spirit of the invention.

What is claimed is:

1. A shielding device disposed on a circuit board for covering an electronic component, the shielding device comprising:
a first case comprising:
an upper casing formed in a plate shape;
a lateral casing connected to the upper casing;
at least one first limiting structure connected to the lateral casing; and
at least one second limiting structure connected to the upper casing; wherein the at least one first limiting structure and the at least one second limiting structure are disposed at opposite side edges of the first case respectively; and
a second case mounted on the circuit board, the second case comprising:
a frame, the frame forming an opening; wherein when the first case is connected with the second case, at least one portion of the at least one second limiting structure can move along a first direction to a bottom of the frame and the at least one second limiting structure is prevented from moving along a second direction, wherein the first direction is perpendicular to the second direction and parallel to the circuit board; and
at least one first slot disposed in the frame, the at least one first slot corresponding to the at least one first limiting structure respectively to allow the at least one first limiting structure to be inserted into the first slot along the first direction and the at least one first limiting structure is prevented from moving along the second direction.

2. The shielding device as claimed in claim 1, wherein the at least one second limiting structure is an L-shaped structure having a perpendicular portion for limiting the movement in the first direction and a horizontal portion for limiting the movement in the second direction.

3. The shielding device as claimed in claim 1, wherein the second case further comprises at least one first gap disposed on an inner side of the frame, the at least one first gap corresponding to the at least one second limiting structure respectively.

4. The shielding device as claimed in claim 3, wherein the at least one second limiting structure further extends to form at least one engaging structure, the frame comprises at least one second slot, wherein when the first case is connected with the second case, the at least one engaging structure is fastened to the at least one second slot respectively.

5. The shielding device as claimed in claim 4, wherein the at least one second limiting structure and the at least one engaging structure form a U-shape structure, when the first case is connected with the second case, the at least one engaging structure is perpendicular to the frame of the second case.

6. The shielding device as claimed in claim 3, wherein the first case further comprises at least one third limiting structure, the second case further comprises at least one second gap corresponding to the at least one third limiting structure to allow the at least one third limiting structure to move along the first direction to the bottom of the frame through the at least one second gap.

7. The shielding device as claimed in claim 6, wherein the at least one third limiting structure is an L-shaped structure having a perpendicular portion for limiting the movement in the first direction and a horizontal portion for limiting the movement in the second direction.

8. The shielding device as claimed in claim 6, wherein the at least one second limiting structure and the at least one third limiting structure are disposed at a same side of the first case respectively; the at least one first gap and the at least one second gap are disposed at a same side of the second case respectively.

9. The shielding device as claimed in claim 8, wherein the at least one second limiting structure and the at least one third limiting structure are arranged on the same side of the first case by turns; the at least one first gap and the at least one second gap are disposed at a same side of the second case by turns.

10. The shielding device as claimed in claim 1, wherein the lateral casing is formed in a U-shaped structure; and the lateral casing is perpendicularly connected to the upper casing.

11. The shielding device as claimed in claim 1, wherein a height calculated from the upper casing of the first case to an end of the lateral casing is two to three times a width of the cross section of the lateral casing of the first case.

12. An electronic device having a shielding device, comprising:
   a circuit board:
   an electronic component disposed on the circuit board; and
   the shielding device disposed on the circuit board for covering the electronic component, the shielding device comprising:
   a first case comprising:
      an upper casing formed in a plate shape;
      a lateral casing connected to the upper casing;
      at least one first limiting structure connected to the lateral casing; and
      at least one second limiting structure connected to the upper casing; wherein the at least one first limiting structure and the at least one second limiting structure are disposed at opposite side edges of the first case respectively; and
   a second case mounted on the circuit board, the second case comprising:
      a frame, the frame forming an opening; wherein when the first case is connected with the second case, at least one portion of the at least one second limiting structure can move along a first direction to a bottom of the frame and the at least one second limiting structure is prevented from moving along a second direction, wherein the first direction is perpendicular to the second direction and parallel to the circuit board; and
      at least one first slot disposed in the frame, the at least one first slot corresponding to the at least one first limiting structure respectively to allow the at least one first limiting structure to be inserted into the first slot along the first direction and the at least one first limiting structure is prevented front moving along the second direction.

13. The electronic device having the shielding device as claimed in claim 12, wherein the at least one second limiting structure is an L-shaped structure having a perpendicular portion for limiting the movement in the first direction and a horizontal portion for limiting the movement in the second direction.

14. The electronic device having the shielding device as claimed in claim 12, wherein the second case further comprises at least one first gap disposed on an inner side of the frame, the at least one first gap corresponding to the at least one second limiting structure respectively.

15. The electronic device having the shielding device as claimed in claim 14, wherein the at least one second limiting structure further extends to form at least one engaging structure, wherein the at least one second limiting structure and the at least one engaging structure form a U-shape structure, the frame comprises at least one second slot, wherein when the first case is connected with the second case, the at least one engaging structure is fastened to the at least one second slot respectively and the at least one engaging structure is perpendicular to the frame of the second case.

16. The electronic device having the shielding device as claimed in claim 14, wherein the first case further comprises at least one third limiting structure, the second case further comprises at least one second gap corresponding to the at least one third limiting structure to allow the at least one third limiting structure to move along the first direction to the bottom of the frame through the at least one second gap.

17. The electronic device having the shielding device as claimed in claim 16, wherein the at least one third limiting structure is an L-shaped structure having a perpendicular portion for limiting the movement in the first direction and a horizontal portion for limiting the movement in the second direction.

18. The electronic device having the shielding device as claimed in claim 16, wherein the at least one second limiting structure and the at least one third limiting structure are disposed at a same side of the first case respectively; the at least one first gap and the at least one second gap are disposed at a same side of the second case respectively.

19. The electronic device having the shielding device as claimed in claim 12, wherein a height calculated from the upper casing of the first case to an end of the lateral casing is two to three times a width of the cross section of the lateral casing of the first case.

* * * * *